(12) United States Patent
Bietz et al.

(10) Patent No.: US 9,671,434 B2
(45) Date of Patent: Jun. 6, 2017

(54) SENSOR DEVICES AND METHODS FOR USE IN SENSING CURRENT THROUGH A CONDUCTOR

(71) Applicant: Aclara Meters LLC, Hazelwood, MO (US)

(72) Inventors: Steven Lee Bietz, Cypress, TX (US); Subramanyam Satyasurya Chamarti, Atlanta, GA (US)

(73) Assignee: Aclara Meters LLC, Hazelwood, MO (US)

( * ) Notice: Subject to any disclaimer, the term of this patent is extended or adjusted under 35 U.S.C. 154(b) by 142 days.

(21) Appl. No.: 14/454,861

(22) Filed: Aug. 8, 2014

(65) Prior Publication Data

US 2016/0041204 A1 Feb. 11, 2016

(51) Int. Cl.
 *G01R 19/00* (2006.01)
 *G01R 15/18* (2006.01)
 *H01F 38/28* (2006.01)

(52) U.S. Cl.
CPC ........... *G01R 15/18* (2013.01); *G01R 15/181* (2013.01); *G01R 19/00* (2013.01);
(Continued)

(58) Field of Classification Search
CPC G01R 15/181; G01R 19/0092; G01R 15/186; G01R 1/22; G01R 31/40;
(Continued)

(56) References Cited

U.S. PATENT DOCUMENTS

| 3,340,353 A | 9/1967 | Mildner |
| 4,408,175 A * | 10/1983 | Nelson ................... G01R 15/18 174/92 |

(Continued)

FOREIGN PATENT DOCUMENTS

| CN | 201465698 U | 5/2010 |
| CN | 202351323 U | 7/2012 |

(Continued)

OTHER PUBLICATIONS

Practical Aspects of Rogowski Coil Applications to Relaying; Special Report Sponsored by the Power System Relaying Committee of the IEEE Power Engineering Society; Sep. 2010; 72 pp.
(Continued)

*Primary Examiner* — Alesa Allgood
(74) *Attorney, Agent, or Firm* — Polster, Lieder, Woodruff & Lucchesi, L.C.

(57) ABSTRACT

A sensor device for use in detecting current in a conductor is provided. The sensor includes a non-magnetic substrate defining an aperture structured to receive a conductor therein, a coil comprising a plurality of turns wound about at least a portion of the substrate, and a housing for enclosing the substrate and coil. The housing includes a dielectric material having a dielectric constant and positioned adjacent to the coil and at least partially within the aperture such that the dielectric material is disposed between the coil and the conductor when the conductor is received through the aperture and at least one spacer coupled to the aperture to facilitate maintaining a position of the coil relative to the conductor, wherein each of the spacers is positioned offset from the dielectric material such that each of the spacers does not radially extend between the coil and the conductor.

23 Claims, 10 Drawing Sheets

(52) U.S. Cl.
CPC ........ *G01R 19/0092* (2013.01); *G01R 15/186* (2013.01); *H01F 38/28* (2013.01)

(58) Field of Classification Search
CPC ...... G01R 19/0084; G01R 1/20; G01R 31/08; G01R 31/086; G01R 15/142; G01R 21/00; G01R 15/183; G01R 19/2513; G01R 15/18; G01R 21/06; G01R 15/247; G01R 11/24; G01R 1/18; G01R 11/02; E21B 43/243; E21B 17/028; E21B 43/24; E21B 43/2401; E21B 47/02208; E21B 43/305; G01D 4/002

See application file for complete search history.

(56) References Cited

U.S. PATENT DOCUMENTS

| | | | |
|---|---|---|---|
| 4,611,191 A | 9/1986 | Souchere | |
| 4,616,176 A | 10/1986 | Mercure et al. | |
| 4,700,131 A | 10/1987 | Miller | |
| 4,795,973 A * | 1/1989 | Smith-Vaniz | G01R 15/26 324/126 |
| 4,970,476 A * | 11/1990 | Kitagawa | H01F 3/08 333/12 |
| 5,414,400 A | 5/1995 | Gris et al. | |
| 5,442,280 A | 8/1995 | Baudart | |
| 5,461,309 A | 10/1995 | Baudart | |
| 5,502,374 A * | 3/1996 | Cota | G01R 15/186 324/119 |
| 5,982,265 A | 11/1999 | Von Skarczinski et al. | |
| 6,094,044 A | 7/2000 | Kustera et al. | |
| 6,144,277 A * | 11/2000 | Matsui | H01F 17/06 333/12 |
| 6,313,623 B1 | 11/2001 | Kojovic et al. | |
| 6,417,661 B1 | 7/2002 | Berkcan et al. | |
| 6,521,695 B1 | 2/2003 | Peruzzotti et al. | |
| 6,614,218 B1 | 9/2003 | Ray | |
| 6,731,193 B2 | 5/2004 | Meier et al. | |
| 6,822,547 B2 | 11/2004 | Saito et al. | |
| 7,106,162 B2 | 9/2006 | Saito | |
| 7,227,441 B2 | 6/2007 | Skendzic et al. | |
| 7,253,603 B2 | 8/2007 | Kovanko et al. | |
| 7,312,686 B2 * | 12/2007 | Bruno | H01F 27/263 336/229 |
| 7,474,192 B2 | 1/2009 | Skendzic et al. | |
| 7,538,541 B2 | 5/2009 | Kojovic | |
| 7,986,202 B2 * | 7/2011 | Woodson | H01H 83/144 335/18 |
| 8,692,540 B2 * | 4/2014 | Bernklau | G01R 15/186 324/117 H |
| 9,081,040 B2 * | 7/2015 | Chamarti | G01R 15/181 |
| 9,117,588 B2 | 8/2015 | Gross et al. | |
| 2003/0112000 A1 | 6/2003 | Sorenson, Jr. | |
| 2004/0257061 A1 | 12/2004 | George de Buda | |
| 2005/0248430 A1 | 11/2005 | Dupraz et al. | |
| 2005/0253573 A1 | 11/2005 | Budillon et al. | |
| 2006/0006976 A1 * | 1/2006 | Bruno | H01F 27/263 336/229 |
| 2006/0220774 A1 | 10/2006 | Skendzic | |
| 2007/0152651 A1 | 7/2007 | Shiokawa et al. | |
| 2007/0285089 A1 | 12/2007 | Ibuki et al. | |
| 2007/0290695 A1 | 12/2007 | Mahon | |
| 2008/0007249 A1 | 1/2008 | Wilkerson et al. | |
| 2008/0036448 A1 | 2/2008 | Kovach et al. | |
| 2008/0079251 A1 | 4/2008 | Rea et al. | |
| 2008/0106253 A1 | 5/2008 | Kojovic | |
| 2008/0211484 A1 | 9/2008 | Howell | |
| 2008/0303511 A1 | 12/2008 | Grno | |
| 2010/0013460 A1 | 1/2010 | Ermisch et al. | |
| 2010/0155136 A1 | 6/2010 | Woodson et al. | |
| 2011/0025304 A1 | 2/2011 | Lint et al. | |
| 2011/0025305 A1 | 2/2011 | Lint et al. | |
| 2011/0043190 A1 | 2/2011 | Farr | |
| 2011/0148561 A1 * | 6/2011 | Lint | G01R 15/181 336/192 |
| 2011/0204879 A1 | 8/2011 | Peretto | |
| 2012/0098519 A1 | 4/2012 | Juds et al. | |
| 2013/0043967 A1 | 2/2013 | Rouaud et al. | |
| 2013/0063125 A1 | 3/2013 | Chamarti et al. | |
| 2013/0063129 A1 | 3/2013 | Chamarti et al. | |
| 2013/0063131 A1 | 3/2013 | Chamarti et al. | |
| 2013/0063161 A1 | 3/2013 | Chamarti et al. | |

FOREIGN PATENT DOCUMENTS

| | | | |
|---|---|---|---|
| CN | 103630723 A | 3/2014 | |
| EP | 2568300 A2 * | 3/2013 | ........... G01R 15/181 |
| EP | 2626870 A1 | 8/2013 | |
| EP | 2722679 | 4/2014 | |
| EP | 2722679 A1 | 4/2014 | |
| EP | 2982993 A1 | 2/2016 | |
| WO | 2009139521 A1 | 11/2009 | |

OTHER PUBLICATIONS

EP Search Report and Opinion issued in connection with corresponding EP Application No. 15178311.5 on Dec. 15, 2015.
European Search Report for Application No. 15178311.5 mailed Dec. 12, 2015.
Search Report issued in connection with EP Application No. 12180314.2, Nov. 29, 2012.
Taehwatrans Products, Clamp-On Weather Proof Rogowski Coil, available at http://www.taehwatrans.com/bbs/board.php?bo_table=product_02&wr_id=10, last visited Jul. 30, 2014.
Riveni Chemicals, Thermoplastic Resin, available at http://www.trivenichemical.com/resin4.html, last visited Jul. 30, 2014.
Dielectric Constants of Various Materials Table, available at http://www.csgnetwork.com/dieconstantstable.html, last visited Jul. 30, 2014.
Bakelite, available at http://en.wikipedia.org/wiki/Bakelite, last visited Jul. 30, 2014.
Dupont™ Crastin® Polybutylene Terephthalate (PBT) Polyester Resin, available at http://www2.dupont.com/Plastics/en_US/Products/Crastin/Crastin.html , last visited Jul. 30, 2014.
Synthetic Resin, available at http://en.wikipedia.org/wiki/Synthetic_resin, last visited Jul. 30, 2014.

* cited by examiner

SENSOR DEVICES AND METHODS FOR USE IN SENSING CURRENT THROUGH A CONDUCTOR

BACKGROUND OF THE INVENTION

The field of the invention relates generally to sensor devices and methods and, more particularly, sensing current through a conductor.

At least some known utility meters are used to measure electricity supplied from a power source to a user. To enable an amount of energy supplied to a user to be accurately measured, utility meters often include one or more sensor devices to sense current flowing through a conductor between the power source and the user. When included in a utility meter, the sensor device is intended to function accurately over an operating range of voltages and/or currents.

Various types of known current sensor devices are used in utility meters. For example, at least some known transformer sensor devices include a magnet core with magnet wire wound thereon to sense current flowing through a conductor. Current sensor devices including transformers, however, are generally known to be bulky and expensive. Current sensor devices with magnetic cores are vulnerable to external magnetic fields. Exposure to external magnetic fields reduces the accuracy of magnetic core current sensor devices, in some cases to as the point where the current device only registers as little as 8% of the current that the current device is supposed to be sensing. Temperature cycles may also affect the magnetic core of current sensors and cause magnetic drift which reduces the accuracy of the current sensor.

Another example of a known current sensor device is a Rogowski coil. Rogowski coils include a coil and are generally smaller than transformer sensor devices. However, Rogowski coils are known to provide only limited accuracy during low current and/or high current conditions over a range of voltages. As a result, during manufacturing, utility meters with known Rogowski coils are often subjected to multiple calibration processes to minimize the effects of these inaccuracies. Although these repeated calibration processes may reduce the inaccuracies of such sensor devices, the processes also increase manufacturing times and costs of the utility meters.

BRIEF DESCRIPTION OF THE INVENTION

In one embodiment, a sensor device for use in detecting current in a conductor is provided. The sensor includes a non-magnetic substrate defining an aperture structured to receive a conductor therein, a coil comprising a plurality of turns wound about at least a portion of the substrate, and a housing for enclosing the substrate and coil. The housing includes a dielectric material having a dielectric constant and positioned adjacent to the coil and at least partially within the aperture such that the dielectric material is disposed between the coil and the conductor when the conductor is received through the aperture and at least one spacer coupled to the aperture to facilitate maintaining a position of the coil relative to the conductor, wherein each of the spacers is positioned offset from the dielectric material such that each of the spacers does not radially extend between the coil and the conductor.

In another embodiment, a utility meter for use in transmitting electrical energy from a power source to a user is provided. The utility meter includes a first sensor device positioned at least partially around a first conductor to sense a current flowing through the first conductor and to output a signal representative of the sensed current and a meter control board in communication with the first sensor device to receive the signal representative of the sensed current from the first sensor device and to determine an amount of electricity transmitted through the conductor from the power source to the user over time. The first sensor device includes a non-magnetic substrate defining an aperture structured to receive the first conductor therein, a coil comprising a plurality of turns wound about at least a portion of the substrate, and a housing for enclosing the substrate and coil. The housing includes a dielectric material having a dielectric constant and positioned adjacent to the coil and at least partially within the aperture such that the dielectric material is disposed between the coil and the first conductor when the first conductor is received through the aperture and at least one spacer coupled to the aperture of the housing to facilitate maintaining a position of the coil relative to the first conductor, wherein each of the spacers is positioned offset from the dielectric material such that each of the spacers does not radially extend between the coil and the first conductor. The first sensor device is positioned relative to the first conductor to consequently reduce a sensitivity of the first sensor device such that the meter control board comprises only one calibration coefficient for calibrating the first sensor device over a current range, where the current range is about 0.2 A to about 25,000 A.

In yet another embodiment, a method of fabricating a utility meter for use in transmitting electrical energy from a power source to a user is provided. The method includes providing a first sensor device positioned at least partially around a first conductor to sense a current flowing through the first conductor and to output a signal representative of the sensed current, wherein providing the first sensor device includes forming a coil comprising a plurality of turns wound about a non-magnetic substrate where the coil defines an aperture through which the first conductor is to be received and enclosing in a housing the coil and substrate. Enclosing in the housing includes positioning a dielectric adjacent to the coil and at least partially within the aperture such that the dielectric material is disposed between the coil and the first conductor when the first conductor is received through the aperture and positioning at least one spacer at the aperture of the housing to facilitate maintaining a position of the coil relative to the first conductor, wherein each of the spacers is positioned offset from the dielectric such that each of the spacers does not radially extend between the coil and the first conductor. The method further includes connecting a meter control board with the first sensor device to receive the signal representative of the sensed current from the first sensor device and to determine an amount of electricity transmitted through the first conductor from the power source to the user over time, and positioning the first sensor device relative to the first conductor to consequently reduce a sensitivity of the sensor device such that the meter control board comprises only one calibration coefficient for calibrating the sensor device over a current range, where the current range is about 0.2 A to about 25,000 A.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION OF THE INVENTION

Figure 1:
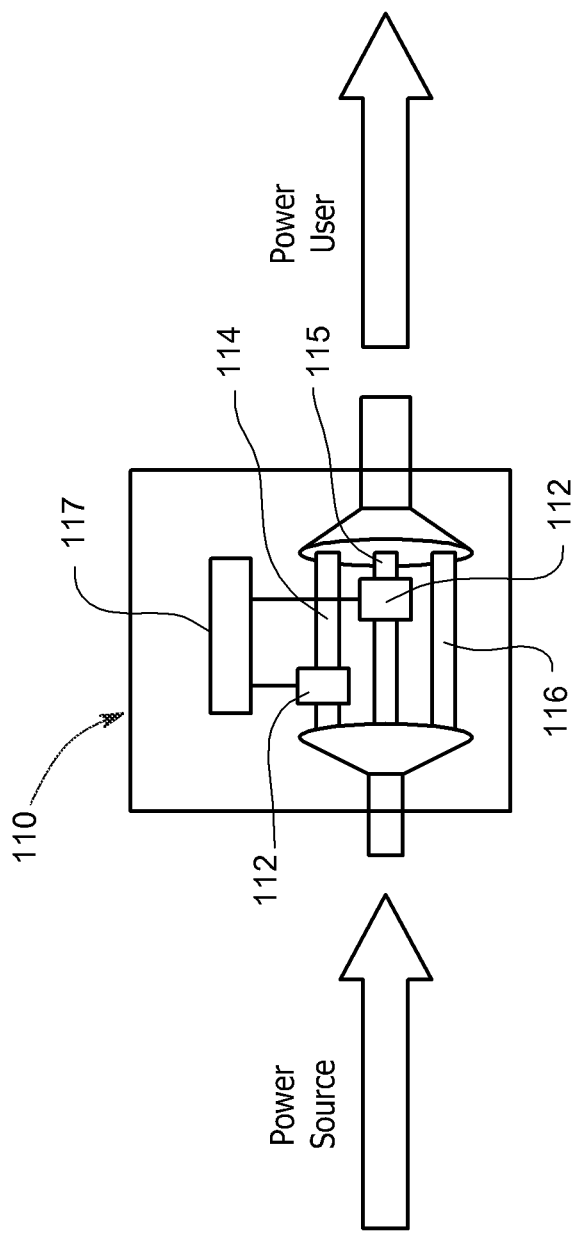
FIG. 1 illustrates a block diagram of an exemplary utility meter including an exemplary sensor device.

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that may permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

The sensor systems described herein provide efficient sensing of current through conductors. The embodiments described herein use a sensor with contains a coil in contact with a dielectric material to sense current through a conductor. The coil and the dielectric material are formed in a toroid around an aperture such that the conductor can be placed through the aperture. The dielectric material in combination with the coil improves the accuracy of the sensor device, such that the sensor device requires one calibration to achieve a high level of accuracy (±0.2%) during the manufacturing process. However, this level of accuracy is depending on the coil not moving in relation to the conductor.

To prevent the coil from moving the sensor device also includes a housing. In the exemplary embodiment, the housing is made of the dialectic material. In other embodiments, the housing encases the dielectric material. The housing includes spacers to hold the conductor in the aperture in a friction fit, and a rotational positioner to prevent the sensor device from rotating. The spacers are positioned offset from the aperture to prevent additional material from being positioned between the coil and the conductor.

In the exemplary embodiment, the housing comprises two portions that are coupled together using U-clips. The two portions of the housing are formed such that the retaining portions are recessed and when coupled to the clips, the clips are flush with the walls of the housing.

The housing also includes an epoxy for coupling the coil to the dielectric material, where the clips are used to hold the coil in place while the epoxy sets. The two parts of the housing are designed to couple in a ship-lap joint, where sides of the housing overlap and the join forms an S shape. By using a ship-lap joint the sides of the housing keep a consistent thickness of dielectric material, while creating a longer path for arc discharges to travel along. The corners of the housing at the aperture are angled and are tapered in thickness to control the amount of dielectric material between the coil and the conductor.

By preventing the coil from moving in relation to the conductor, the accuracy of the sensor device will not change over time. In a meter, where there may be multiple conductors and multiple sensor devices, preventing the sensor device from moving in the electromagnetic fields in relation to the other conductors and the other sensor devices will also prevent the sensor's accuracy from changing over time.

FIG. 1 illustrates a block diagram of an exemplary utility meter 110 including an exemplary sensor device 112. In the exemplary embodiment, utility meter 110 includes sensor device 112, a conductor 114, and a meter control board 117 coupled to sensor device 112. Conductor 114 may include a bus bar, multi-strand wire, single-strand wire, cable, or other suitable conductor to transmit electricity from a power source to a power user. The power source may include, without limitation, an electrical grid and/or a power generator system, such as a gas turbine engine, a hydroelectric turbine, a wind turbine, a solar panel, and/or another suitable generation and/or transmission system. The power source may also include a smart-grid in communication with meter control board 117. A user may include, without limitation, a residential user, a commercial user and/or any other user of electricity at any level. Sensor device 112 is coupled to conductor 114 to sense current flowing through conductor 114. Sensor device 112 provides a signal representative of sensed current to meter control board 117. Based on the signal received from sensor device 112, meter control board 117 determines an amount of electricity transmitted through conductor 114 from the power source to the user over time.

Because a charge may be incurred for electricity transferred from the power source to the user, it is desirable that sensor device 112 is highly accurate to ensure the user is charged substantially only for electricity received, rather than being charged for substantially all the electricity transmitted to the user by the operator of the power source.

In this exemplary embodiment, utility meter 110 further includes conductors 115 and 116 and another sensor device 112 coupled to conductor 115. It should be appreciated that any number of conductors and/or sensor devices (e.g., one, three, six, etc.) may be used in other utility meter embodiments. Moreover, it should be appreciated that sensor device 112 is not limited to only being used within utility meter 110, but may be utilized in virtually any application to sense current through a conductor, such as power generation applications, utility applications, automotive applications, appliance applications, telecommunication applications, etc.

Figure 2:
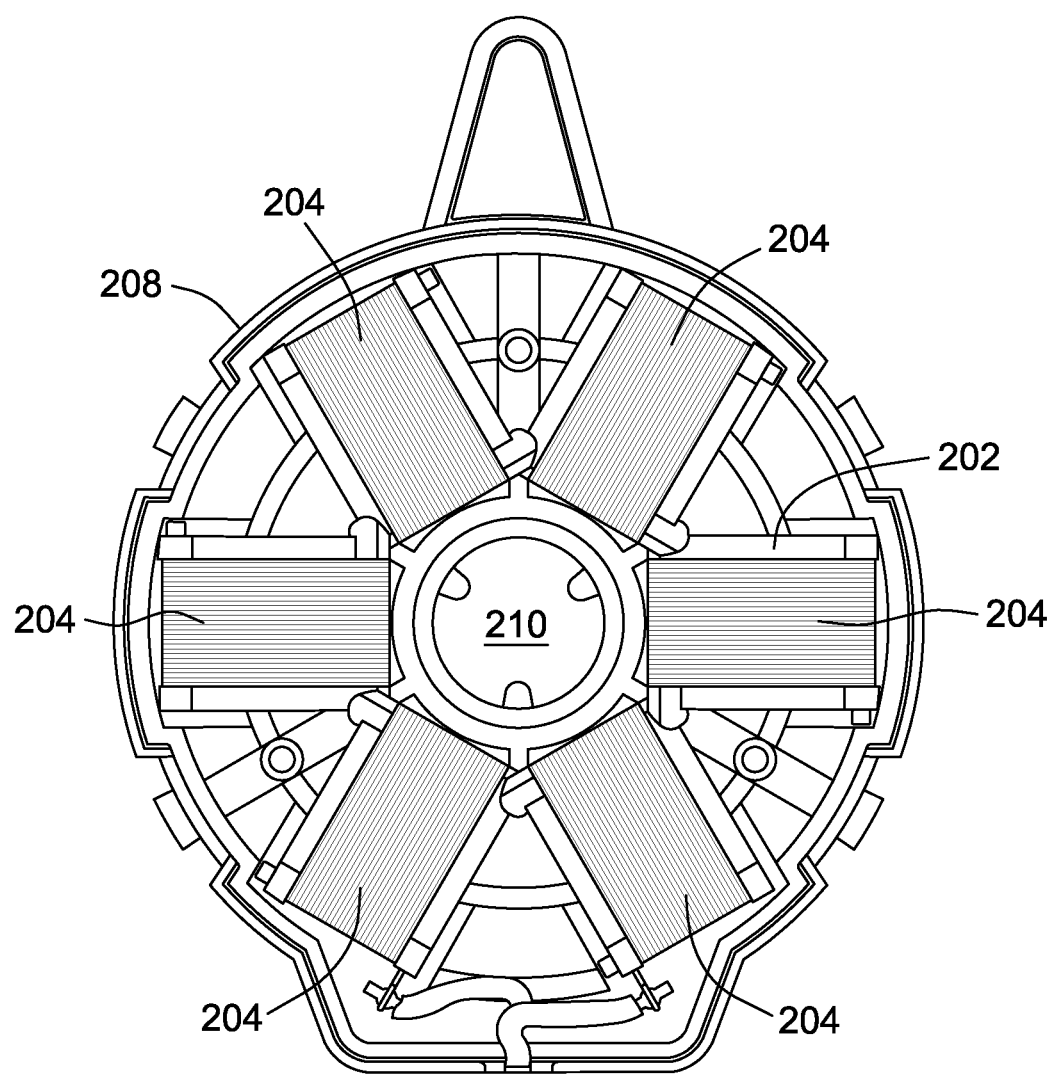
FIG. 2 illustrates a partially disassembled view of exemplary sensor device.

FIG. 2 illustrates a partially disassembled view of exemplary sensor device 112. In the exemplary embodiment, sensor device 112 includes a substrate 202, a coil 204 including a plurality of turns wound about substrate 202, and a dielectric material 208. Coil 204 includes an aperture 210 defined therein, which is structured (e.g., by size, orientation, and/or shape, etc.) to receive conductor 114 therein. Dielectric material 208 is positioned adjacent to coil 204 and at least partially within aperture 210. More specifically, in this embodiment, dielectric material 208 is positioned at least partially between coil 204 and conductor 114, when conductor 114 is positioned through aperture 210.

Dielectric material 208 may include one or more dielectric materials having a variety of characteristics configured in a variety of ways. Dielectric material 208 has at least one thickness, and may have various thicknesses. In the exemplary embodiment, dielectric material 208 positioned adjacent to coil 204 and at least partially within aperture 210 has a thickness of about 3.0 millimeters. Also, in the same embodiment, dielectric material 208 positioned adjacent to coil 204 but opposite aperture 210 has a thickness of about 1.2 millimeters. It should be appreciated that dielectric material 208 may have any thickness or thicknesses, that enables sensor device 112 to function as described herein. Generally, thickness of dielectric material 208 is selected, at least partially based on the dielectric constant of dielectric material 208, the proximity of coil 204 to one or more conductors 114, 115 and 116 (shown in FIG. 1), and/or space available in an intended environment for installation of the sensor device, etc. In some example embodiments, the thickness of dielectric material 208 may range from about 1.0 millimeter to about 3.0 centimeters, or greater in still other embodiments.

In the exemplary embodiment, dielectric material 208 may be fabricated from one or more of several types of material, such as, without limitation, plastic materials, thermoplastic materials, thermoset materials, ceramic materials, metallic materials, wood materials, clay materials, organic materials, any mixture thereof, and/or other materials suitable to perform as described herein. In the exemplary embodiment of FIG. 2, dielectric material 208 includes a PBT thermoplastics material commercially available from a Valox® family of materials. In various embodiments, dielectric material 208 includes one or more of, without limitation, Kapton® tape, a polyvinylidene fluoride (PVDF) material, a room temperature vulcanized silicone (RTV) polymer, a PBT thermoplastics material commercially available from a Valox® family of materials (e.g., Valox® 365 or Valox® V9561), a polyethylene terephthalate (PET) thermoplastic material from the Rynite® family of materials, a PPS thermoplastic material commercially available from the Ryton® family of materials, a PPS thermoplastic material commercially available from the Primef® family of materials, a nylon thermoplastic material commercially available from the Zytel®, Stanyl®, or RTP® families of materials, a LCP thermoplastic material (e.g., Sumitomo® E5008L or E4008L materials), etc. One or more types of dielectric material 208 may be selected based on dielectric constant, suitability for one or more manufacturing techniques, dimensional stability, cost, moldability, workability, rigidity, and/or other characteristic of the material(s). In at least one example, dielectric material 208 is selected at least partially based on the variability of its dielectric constant over temperature.

Figure 3:
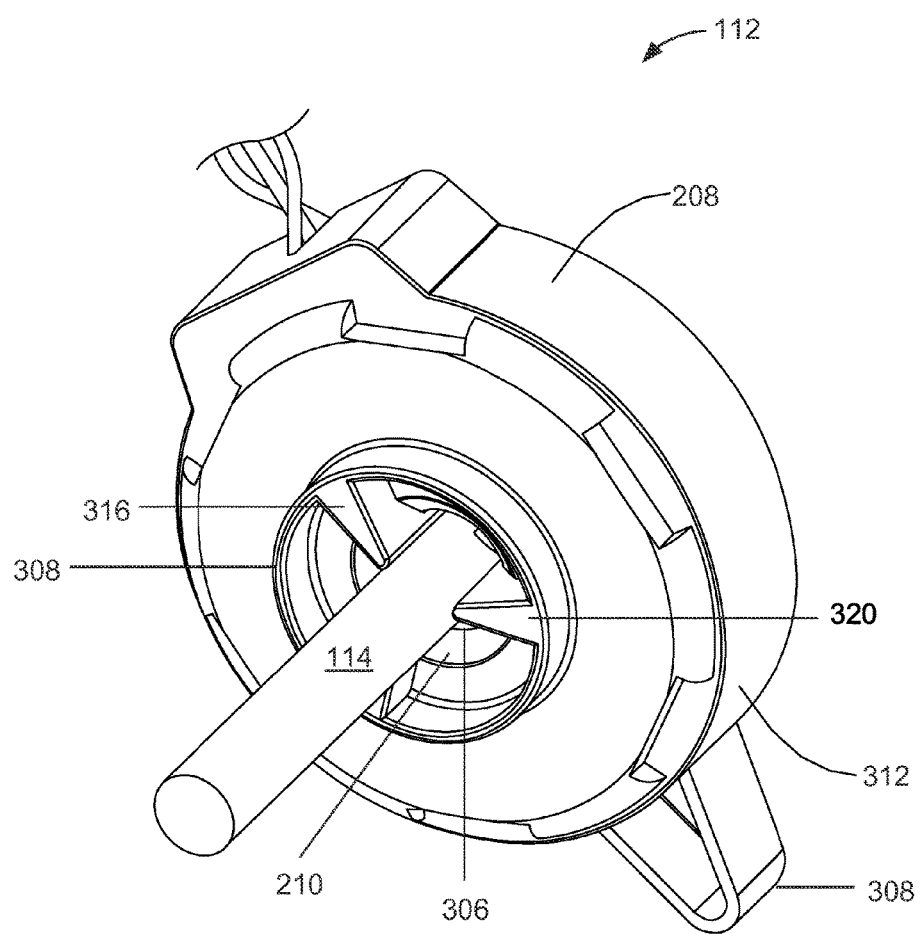
FIG. 3 is a perspective view of sensor device (shown as assembled) with conductor extending through aperture.

FIG. 3 is a perspective view of sensor device 112 (shown as assembled) with conductor 114 extending through aperture 210. As described above, sensor device 112 senses current flow through conductor 114. Specifically, when current flows through conductor 114, a current is induced in coil 204 (shown in FIG. 2). The amount of current induced in coil 204 is representative of the amount of current flowing through conductor 114. When sensor device 112 is positioned around conductor 114, coil 204 is spaced a distance from conductor 114. Accordingly, capacitance exists between coil 204 and conductor 114. The capacitance may affect the accuracy of sensor device 112 at different operating voltages. In the exemplary embodiment, dielectric material 208 is positioned within at least a portion of an air-gap 306 defined between coil 204 and conductor 114.

The reduction in capacitance enables sensor device 112 to sense current flowing through conductor 114 with improved accuracy, as compared to known Rogowski coils or other air-gap coils. More specifically, by reducing capacitance coupling between coil 204 and conductor 114, the sensitivity to operating voltage is reduced. As a result, consistent current sensing is provided at different operating voltages across a range of different currents, including high and low currents. Accordingly, when sensor device 112 is included in utility meter 110 (shown in FIG. 1), one or more processes necessary for calibrating known sensor devices may be omitted. Specifically, in the exemplary embodiment, the consistency of sensor device 112 to accurately detect current across different operating voltages may permit meter control board 117 (shown in FIG. 1) to use only one calibration coefficient for a plurality of operating voltages, as compared to known utility meters, which require multiple calibration coefficients for use at different voltages. Moreover, the reduction in capacitance between coil 204 and conductor 114 not only facilitates reducing and/or simplifying the calibration processes, but also facilitates reducing manufacturing cost, resources, and/or time with at least the same and often improved accuracy across operating voltage/current ranges.

Over time, movement of coil 204 in reference to conductor 114 will affect the calibration of sensor device 112. Preventing coil 204 from moving ensures that the calibration coefficient previously calculated during the calibration process will continue to provide accurate readings from sensor device 112. Movement could be laterally along conductor 114, rotationally moving coil 204 around conductor 114, or even movement of coil 204 itself within sensor device 112.

As shown in FIG. 3, in this exemplary embodiment, sensor device 112 includes a housing 312. Housing 312 may be formed from a variety of materials and/or through a variety of fabrication processes. In the exemplary embodiment, housing 312 includes substantially only dielectric material 208, such that dielectric material 208 is positioned about coil 204, opposite aperture 210 (as shown in FIG. 2). As such, when used within utility meter 110 having three-phase conductors 114, 115, and 116 (shown in FIG. 1), sensor device 112 may be positioned about conductor 114 and proximate to at least one other conductor 115 (as shown in FIG. 1), and potentially proximate to conductor 116. Similar to the interaction between coil 204 and conductor 114, a capacitance exists between coil 204 and conductor 115, which may adversely affect and/or degrade the accuracy of sensor device 112. Due to the position of dielectric material 208 opposite aperture 210, dielectric material 208 is positioned between coil 204 and adjacent conductor 115. Accordingly, dielectric material 208 is further provided to reduce capacitance between coil 204 and conductor 115. In this manner, sensor device 112 may provide improved accuracy when used in utility meter 110 having multiple conductors and/or when used in close proximity to one or more other conductors, as compared to known air-gap coils.

In some embodiments, housing 312 may include one or more materials in addition to dielectric material 208, such as non-dielectric materials or dielectric materials that have different characteristics. In one embodiment, housing 312 includes dielectric material 208 and an additive material, which is provided to support dielectric material 208 in one or more locations relative to coil 204 to enable it to perform as described herein. The additive material may include plastic materials, thermoplastic materials, thermoset materials, ceramic materials, metallic materials, wood materials, clay materials, organic materials, any mixture thereof, and/or other suitable materials. The additive material may be selected based on manufacturing techniques, dimensional stability, cost, moldability, workability, rigidity, and/or other characteristics of the material, etc. In such embodiments, when dielectric material 208 is a higher cost material (as compared to the additive material); the inclusion of an additive material may reduce the overall cost of sensor device 112. Further, one or more additive materials may be used to perform one or more additional functions, such as supporting dielectric material 208, protecting and/or insulating coil 204, etc. As should be apparent, the additive material may be used as part of housing 312 in various embodiments. In the exemplary embodiment, however, an additive material is omitted, as housing 312 substantially only includes dielectric material 208.

Housing 312 may be fabricated from the dielectric material, formed integrally from dielectric material 208 and at least one additive material, or assembled from separate dielectric material(s) 208 and additive material(s). Housing 312 and/or dielectric material 208 may be fabricated using one or more injection molding processes and/or other suitable fabrication processes. In the exemplary embodiment, housing 312 is constructed via a single injection molding process, in which dielectric material 208 is injected into a mold structured to form housing 312.

Alternatively, housing 312 may be constructed from a multi-stage injection molding process. In a multi-stage process, an additive material is molded into a specific shape through an initial molding process. Subsequently, the molded additive material is positioned within a mold, and dielectric material 208 is injected into the mold. Dielectric material 208 flows into voids defined between the mold and/or the additive material, to form housing 312 from dielectric material 208 and additive material. In various embodiments, a multi-stage molding process may permit a relatively high-cost dielectric material to be specifically positioned relative to coils 204 such that desired performance as described herein is achieved, while still permitting other portions of housing 312 to be constructed from one or more relatively low cost materials.

It should be appreciated that housing 312 may be constructed by other fabrication techniques to provide dielectric material 208 throughout or at desired positions relative to coil 204 and/or conductor 114. In one example, dielectric material 208 is constructed separately from an additive material, and subsequently transformed and/or constructed with the additive material to form housing 312. In yet another example, a tubular dielectric material may be inserted into an aperture formed by an additive material to form housing 312.

In the exemplary embodiment, housing 312 includes one or more spacers 316 that surround the aperture 210. When conductor 114 is received in aperture 210 (as shown in FIG. 3), an air-gap 306 is formed between housing 312 and conductor 114. Simultaneously, a friction fit is created between spacers 316 and conductor 114. Spacers 316 are offset from aperture 210 by an offset ring 308. Spacers 316 and offset ring 308 may include dielectric material 208 and/or another material. It should be appreciated that spacers 316 may be formed in a variety of different shapes that are designed to receive and/or couple to various types, shapes, and/or orientations of conductors. In the exemplary embodiment, spacers 316 are shaped as crush ribs with curved points. The crushed ribs maintain a pressure on conductor 114 to prevent housing 312 from moving in relation to conductor 114. To ensure that the pressure on conductor 114 remains constant, offset ring 308 provides reinforcement to spacers 316 and is formed of a rigid material as described above. Offset ring 308 also ensures that sensor device is spaced a distance away from any other object in meter 110 that may be touching conductor 114. The electromagnetic field of conductor 114 changes when conductor is being touched by another object, especially one that conducts electricity, such as a clip. By offsetting sensor device 112 from other objects touching conductor 114, sensor device 112 can provide more accurate readings.

Housing 312 also includes at least one rotational positioner 320. Rotational positioner 320 prevents coil 204 from rotating around conductor 114. The position of coil 204 in relation to conductor 114 and to conductors 115 and 116 affects the accuracy of sensor device 112, when sensor device 112 is surrounding conductor 114. Rotating coil 204 in the electromagnetic fields generated by those conductors can affect the calibration of sensor device 112 and thus the accuracy. To prevent the possibility of rotation of coil 204, housing 312 includes rotational positioner 320. Rotational positioner 320 prevents rotary movement when placed against a corner or rib in meter 110.

Figure 4:
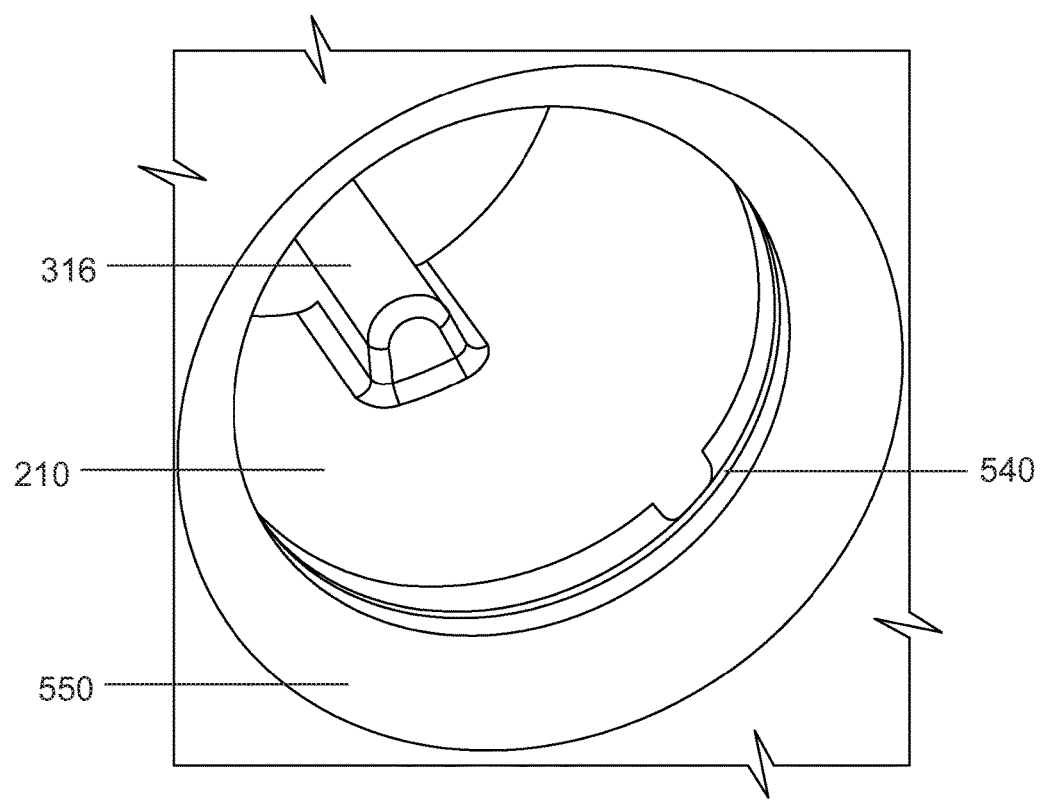
FIG. 4 illustrates a close-up view of aperture defined by sensor device, in accordance with one embodiment of the disclosure.

FIG. 4 illustrates a close-up view of aperture 210 defined by sensor device 112, in accordance with one embodiment of the disclosure. Offset ring 308 offsets spacers 316 from aperture 210. Offset ring 308 allows spacers 316 to maintain sensor device's 112 position relative to conductor 114, while not interfering between conductor 114 and coil 204. In the exemplary embodiment, spacers 316 do not radially extend into aperture 210 more than one third of the thickness of aperture 210. This is to prevent the material comprising spacers 316 from interfering with the amount of material between coil 204 and conductor 114. Ensuring that the thickness of material between coil 204 and conductor 114 is consistent for the entire circumference of coil prevents variation in the electromagnetic fields and thus with the readings of the current through conductor 114. In at least one embodiment, offset ring 308 and spacers 316 are structured to form a friction fit with a rectangular-shaped bus bar conductor.

Figure 5:
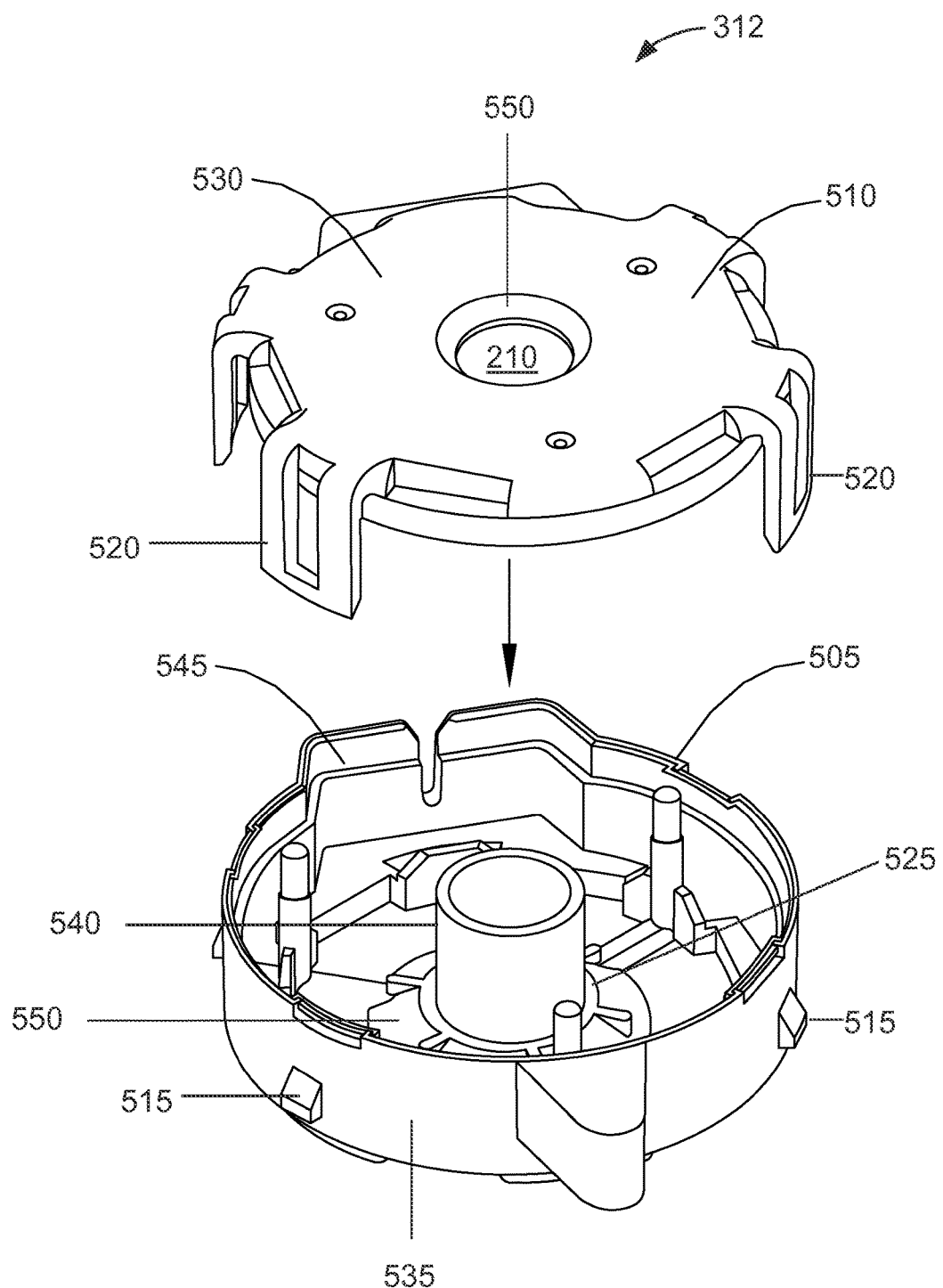
FIG. 5 illustrates the assembly of the housing of the sensor device, in accordance with one embodiment of the disclosure.

FIG. 5 illustrates the assembly of housing 312 of sensor device 112, in accordance with one embodiment of the disclosure. Housing 312 includes a first portion 505 and a second portion 510. First portion 505 is releasably coupled to second portion 510 such that substrate 202 and coil 204 are substantially enclosed therein. In the exemplary embodiment, when housing 312 is assembled, first portion 505 is coupled to second portion 510 with a major ship-lap joint 540 and a minor ship-lap joint 545 to form housing 312. It should be appreciated that in other embodiments first portion 505 and second portion 510 may be coupled together through a variety of different methods, including, without limitation, one or more butt joints, screw joints, hinge joints, tab-slot arrangements, tongue-and-groove arrangements, fasteners, etc. While housing 312 has generally toroidal shape, it should be appreciated that other enclosure embodiments may define any shape and/or size, that is sized and/or operates to at least partially enclose substrate 202 and coil 204, and that enables dielectric material 208 to perform as described herein.

Further, in the exemplary embodiment, the thickness of dielectric material 208 varies throughout housing 312. Each ship-lap joint 540 and 545 between first portion 505 and second portion 510 provides an overlap of first portion 505 and second portion 510. Specifically, in this exemplary embodiment, first portion 505 and second portion 510 each have a thickness of about 1.2 millimeters at aperture 210. When the first portion 505 and the second portion 510 are assembled, first portion 505 and second portion 510 at least partially overlap at the major ship-lap joint 540 (along aperture 210) to create a total thickness of about 2.4 millimeters. Moreover, in this exemplary embodiment, first portion 505 and second portion 510 are structured such that the total thickness about the outside of housing 312 at a minor ship-lap joint 545 (opposite aperture 210) is less than about 1.2 millimeters. It should be appreciated that various methods of forming housing 312 may be used to provide one or more different thicknesses of housing 312 and/or dielectric material 208. In the exemplary embodiment, the major ship-lap joint 540 runs along a substantial portion of aperture 210. This is to provide a longer path for potential arcs between coil 204 and conductor 114.

In various other embodiments, the thickness of housing 312 and/or dielectric material 208 may be between about 0.5 millimeters and about 3.0 centimeters. In some embodiments, one or more thicknesses of housing 312 and/or dielectric material 208 are between about 1.0 millimeters and 6.0 millimeters. Further, in various embodiments, one or more thicknesses of housing 312 and/or dielectric material 208 are between about 1.0 millimeters and 4.0 millimeters. It should be appreciated that housing 312 and/or dielectric material 208 may have different thickness in other embodiments, potentially based on a method of assembly/fabrication, the characteristic(s) of a selected dielectric material, and/or desired performance characteristic(s). Further, other shapes, sizes, and/or joints for housing 312 may be used to at least partially enclosure coil 204, while positioning dielectric material 208 relative to coil 204 to perform consistent with one or more aspects of the present disclosure.

First portion 505 and second portion 510 also include a connection ring 525, an edge bevel 550, a side wall 530, and an outer wall 535. In the exemplary embodiment, the thickness of side wall 530 is less than that of combined thicknesses of first portion 505 and second portion 510 along aperture 210. Connection ring 525, on both first portion 505 and second portion 510 is where major ship-lap joint 540 of first portion 505 and second portion 510 connect. Connection ring 525 has the same thickness as the combined thicknesses of first portion 505 and second portion 510 at major ship-lap joint 540. Edge bevel 550 connects connection ring 525 to side wall 530. As edge bevel 550 goes from connection ring 525 to side wall 530, the thickness of edge bevel 550 slowly reduces. Where the thickness of edge bevel 550 starts at the thickness of connection ring 525 and slowly and consistently reduces to the thickness of side wall 530. Edge bevel's 550 consistent changes in thickness, prevents interruption in the electromagnetic field that may occur from abrupt changes in the amount of dielectric material 208 in the electromagnetic field.

When first portion 505 and second portion 510 are coupled, minor ship-lap joint 545 is formed along outer wall 535. Minor slip-lap joint 545 runs around the circumference of outer wall 535 when first portion 505 and second portions 510 are coupled. Both major ship-lap joint 540 and minor slip-lap joint 545 retain a clearance between first portion 505 and second portion 510. In the exemplary embodiment, this clearance is between 0.003 inches and 0.005 inches. The clearance is created when coil 204 is sandwiched between first portion 505 and second portion 510. Coil 204 and substrate 202 are sized so that when first portion 505 and second portion 510 are coupled around coil 204 and substrate 202, the fit creates the aforementioned clearance while housing 312 maintains a constant pressure on coil 204 and further prevents coil 204 from moving in relation to first portion 505.

In the exemplary embodiment, coil 204 includes an exemplary Rogowski coil. It should be appreciated; however, that sensor device 112 may include a coil other than a Rogowski coil. Further, aspects of the present disclosure are not limited to only being used with a Rogowski coil as described and illustrated herein.

First portion 505 includes retaining portions 515 and second portion 510 includes U-clips 520. U-clips 520 and retaining portions 515 attach first portion 505 to second portion 510.

Figure 6:
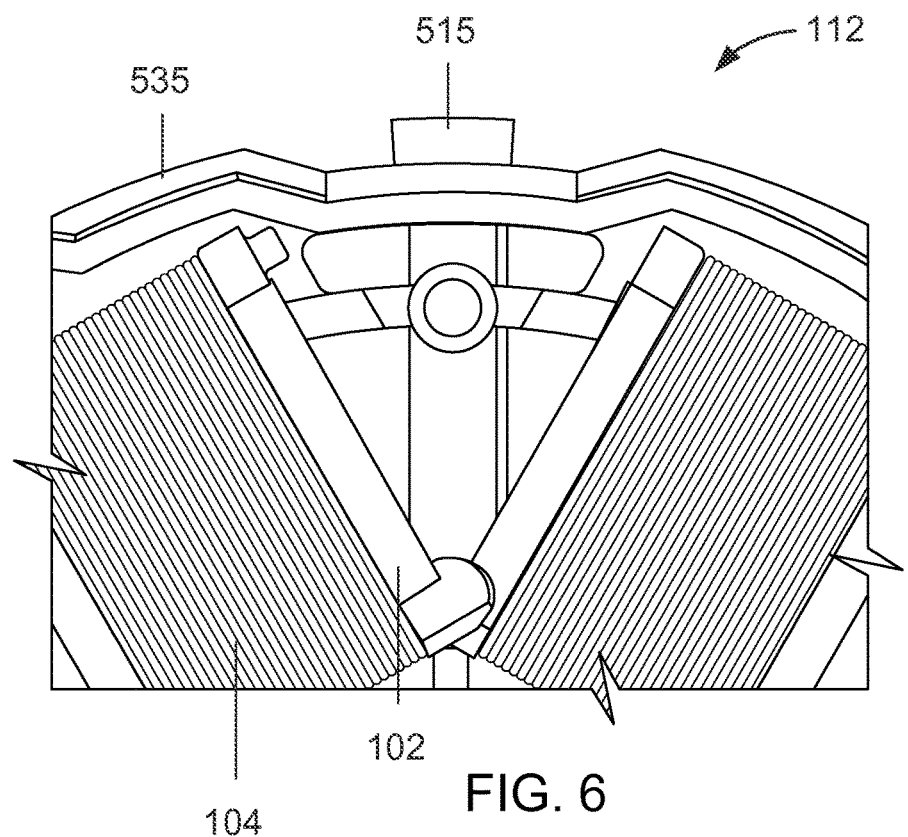
FIG. 6 illustrates a close-up of the first portion of the housing and one of the retaining portions.
Figure 7:
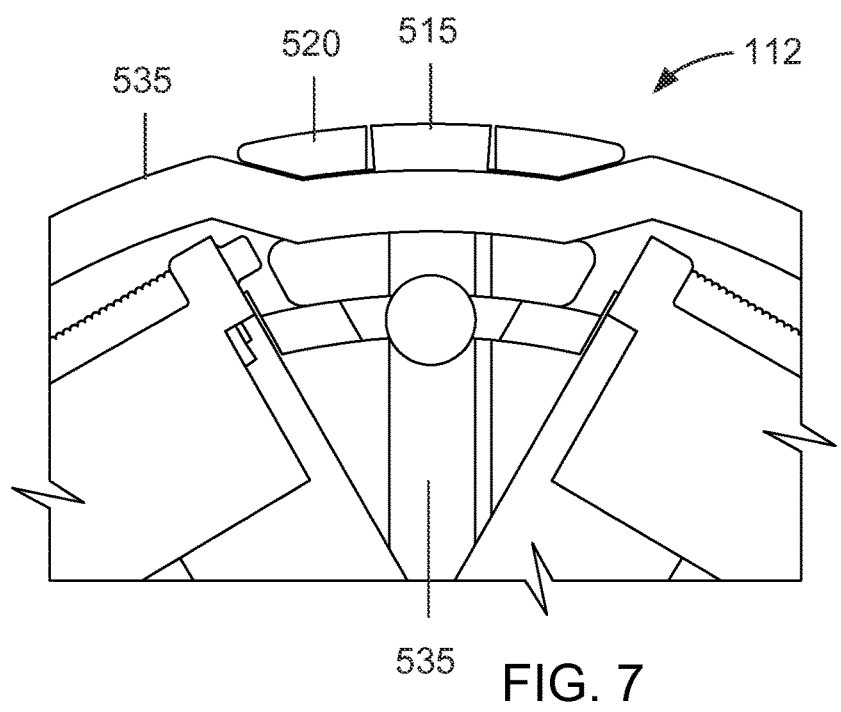
FIG. 7 illustrates a close-up of an assembled sensor device showing a U-clip attached to a retaining portion.

FIG. 6 illustrates a close-up of the first portion 505 of housing 312 and one of the retaining portions 515. FIG. 7 illustrates a close-up of assembled sensor device 112 showing U-clip 520 attached to retaining portion 515. In the exemplary embodiment, outer wall 535 includes a recessed area for receiving U-clip 520. As shown in FIG. 7, when U-clip 520 is coupled to retaining portion 515, U-clip 520 and retaining portion 515 don't extend past outer wall 535. One of the benefits of keeping U-Clip 520 and retaining portion 515 flush with outer wall 535 prevents U-clip 520 from catching on external items or snapping off.

Figure 8:
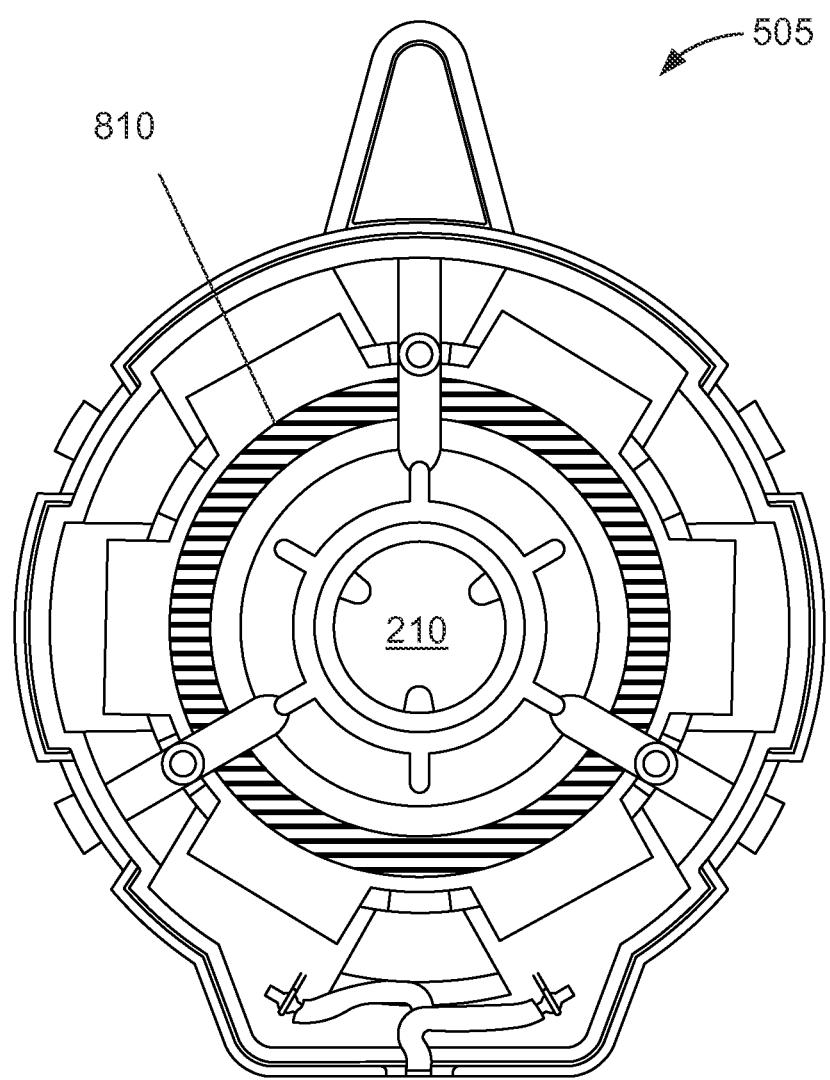
FIG. 8 displays first portion of housing with a layer of epoxy for coupling the coil (shown in FIG. 2) to the first portion.

FIG. 8 displays first portion 505 of housing 312 with a layer of epoxy 810 for coupling coil 204 (shown in FIG. 2) to first portion 505. In the exemplary embodiment, epoxy 810 is a high temperature epoxy, such as Epoxy Resin 6060RP-6 manufactured by Plenox-Wells Electronic Material Co., Ltd. A high temperature epoxy is used to resist the decay of epoxy 810 at high temperatures over time. In manufacturing sensor device 112, epoxy 810 is placed in first portion 505. Coil 204 is placed into first portion 505 into epoxy 810. Then second portion 510 (shown in FIG. 5) is coupled to first portion 505 so that coil 204 is firmly pressed into epoxy 810. Epoxy 810 spreads out to fill empty spaces between first portion 505 and coil 204. The first portion 505 and second portion 510 serve as a holding force while epoxy 810 sets-up/cures to solid, without requiring heating or special treatment of epoxy 810.

Figure 9:
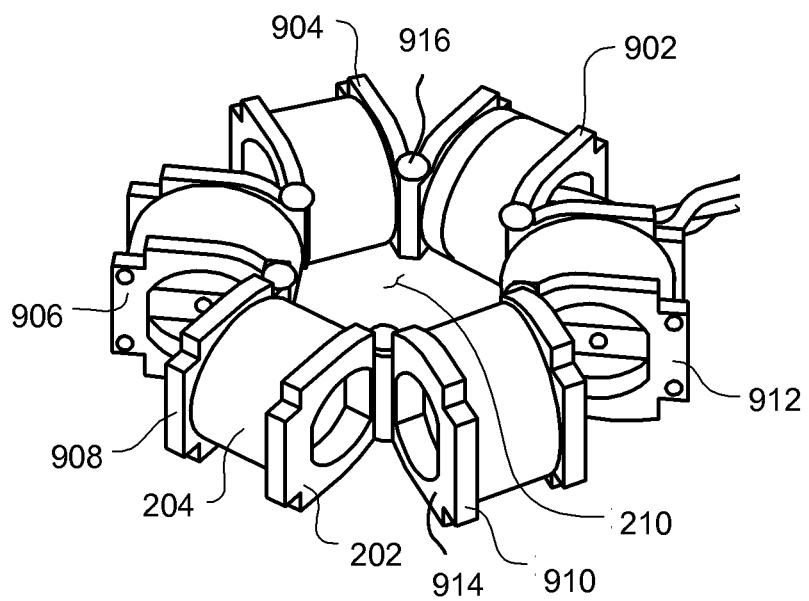
FIG. 9 is a perspective view of the substrate and the coil separated from the housing.

FIG. 9 is a perspective view of substrate 202 and coil 204 separated from housing 312, shown in FIG. 3. In the exemplary embodiment, substrate 202 includes six bobbins 902, 904, 906, 908, 910, and 912 (collectively referred to as bobbins 902-912). Each bobbin 902-912 has a substantially circular cross-section, and more particular, is a right cylinder that includes flanges 914 at opposite ends that retain coil 204. In other embodiments, substrate 202 may have a different number, shape, and/or size of bobbins. For example, substrate 202 may include five bobbins, eight bobbins, ten bobbins, thirty bobbins, or another even or odd number of bobbins. Further, substrate 202 may include bobbins having a different shape, and/or an ovular cross-section, an elliptical cross-section, or rectangular cross-section, etc. In still other embodiments, substrate 202 may include a different structure for supporting coil 204, in addition to or other than flanges 914. In at least one embodiment, coil 204 is sufficient rigid to omit substrate 202.

In the exemplary embodiment, bobbins 902-912 are coupled together via hinged joints 916. More specifically, bobbins 902 and 904 are hingedly coupled to permit pivotal movement there between. In various embodiments, bobbins 902-912 may be linearly aligned to enable efficient winding of coil 204 and/or pivoted relative to one another to form a substantially circular shape, as illustrated in FIG. 9.

Each of bobbins 902-912 of substrate 202 is a non-magnetic structure, such that bobbins 902-912 are constructed from one or more non-magnetic materials, including, for example, thermoplastic material, ceramic material, wood, material, or other kinds of suitable material(s). In this exemplary embodiment, each of bobbins 902-912 is fabricated from a dielectric material, potentially consistent with dielectric material 208. By use of a non-magnet substrate 202, cost savings may be realized over known sensor devices that include one or more magnetic cores. Moreover, in the exemplary embodiment, substrate 202 is shaped and/or sized to provide improved mounting within utility meter 110 and/or to a meter control board 117 (both shown in FIG. 1), as compared to known sensor devices that include bulky magnetic cores. Further, in this exemplary embodiment, bobbins 902-912 are formed separate from housing 312. It should be appreciated, however, that bobbins 902-912 may be formed integrally with and/or form one or more portions of housing 312 in other sensor device embodiments.

In the exemplary embodiment, coil 204 is wound multiple turns on each bobbin 902-912. More specifically, in the exemplary embodiment, coil 204 includes a single magnet wire that enables coil 204 to be wound from bobbin 902 to bobbin 912 with several turns on each bobbin 902-912, and then wound back to bobbin 902 with additional turns on each bobbin 902-912. It should be appreciated that, in other embodiments, other different winding patterns on bobbins 902-912 may be used. Consistent with the above winding pattern across bobbins 902-912, a first end and a second end of coil 204 terminates at bobbin 902.

Figure 10:
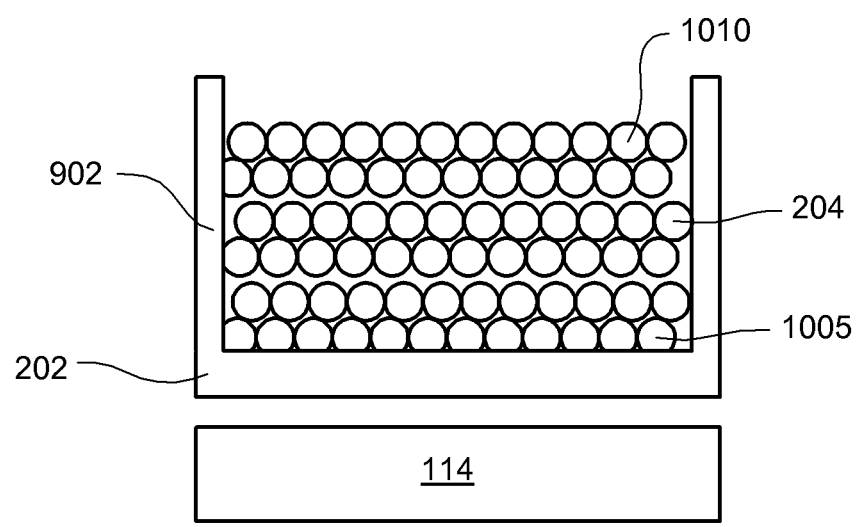
FIG. 10 illustrates a partial cross-sectional view of the sensor device at a bobbin.

In addition to coil 204, in the exemplary embodiment, one or more shields are applied to substrate 202. Specifically, FIG. 10 illustrates a partial cross-sectional view of sensor device 112 at bobbin 902. In the exemplary embodiment, bobbin 902 includes a first shield 1005 and a second shield 1010. First shield 1005 is positioned between bobbin 902 and coil 204. Second shield 1010 is positioned adjacent to coil 204 and opposite from first shield 1005, such that coil 204 is positioned between first shield 1005 and second shield 1010. Each bobbin 902-912 includes substantially the same shield-coil-shield pattern as shown in FIG. 10. In other embodiments, bobbins 902-912 may include other winding patterns, including winding patterns, in which the winding pattern varies from one bobbin to another bobbin.

In the exemplary embodiment, each shield 1005 and 1010 provides a Faraday shield. More specifically, in this exemplary embodiment, first and second shields 1005 and 1010 behave substantially consistent with a Faraday cage, in order to facilitate reducing common mode noise on the sensor device 112 and/or to provide a low-pass filter for high frequency noise filtering. As a result, first and second shield 1005 and 1010 facilitate improved performance in the context of one or more industry standards for electromagnetic interface (EMI) and/or electromagnetic compatibility (EMC).

During fabrication, a plurality of turns of a magnet wire are wound on each bobbin 902-912 from bobbin 902 to bobbin 912 to form first shield 1005. Coil 204 is then wound from bobbin 902 to bobbin 912 and back to bobbin 902 as described above. Subsequently, the magnet wire of first shield 1005 is wound from bobbin 912 back to bobbin 902 with a plurality of turns on each bobbin 902-912 to form second shield 1010. As such, in the exemplary embodiment, first shield 1005 and second shield 1010 are formed from a single magnet wire. It should be appreciated that first shield 1005 and second shield 1010 may include any suitable materials, such as, without limitation, copper, aluminum or other nonferrous conducting material. More generally, the shielding material may be formed as a sheet, a tape, a wire, a spray and/or any other form that enables bobbins 902-912 to include shields 1005 and 1010. As such, application of shields 1005 and/or 1010 may be formed, without limitation, via winding, wrapping, and/or spraying, for example. In various embodiments, first and second shield 1005 and 1010 may be formed separately from coil 204 and subsequently applied to coil 204.

Figure 11:
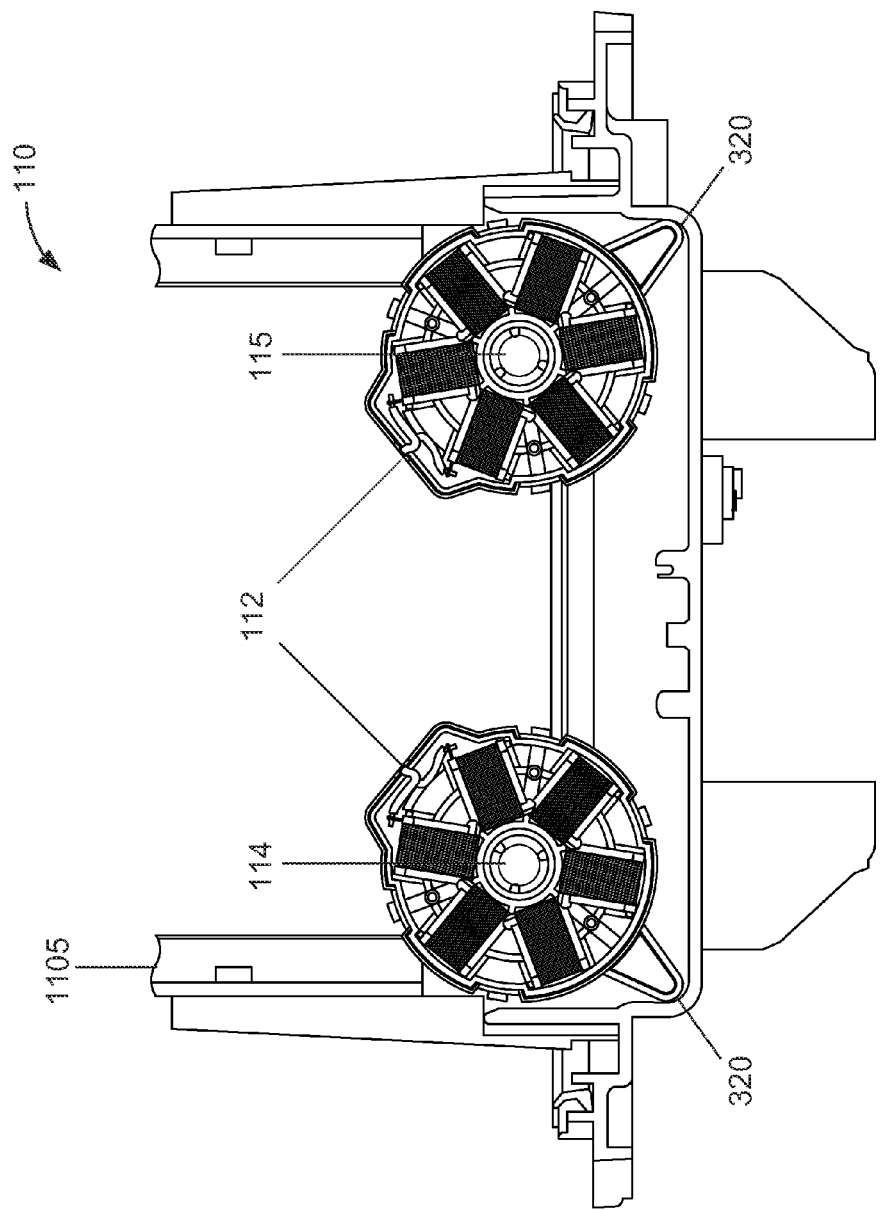
FIG. 11 is a cut-away view of a utility meter with two sensor devices measuring two conductors.
Figure 12:
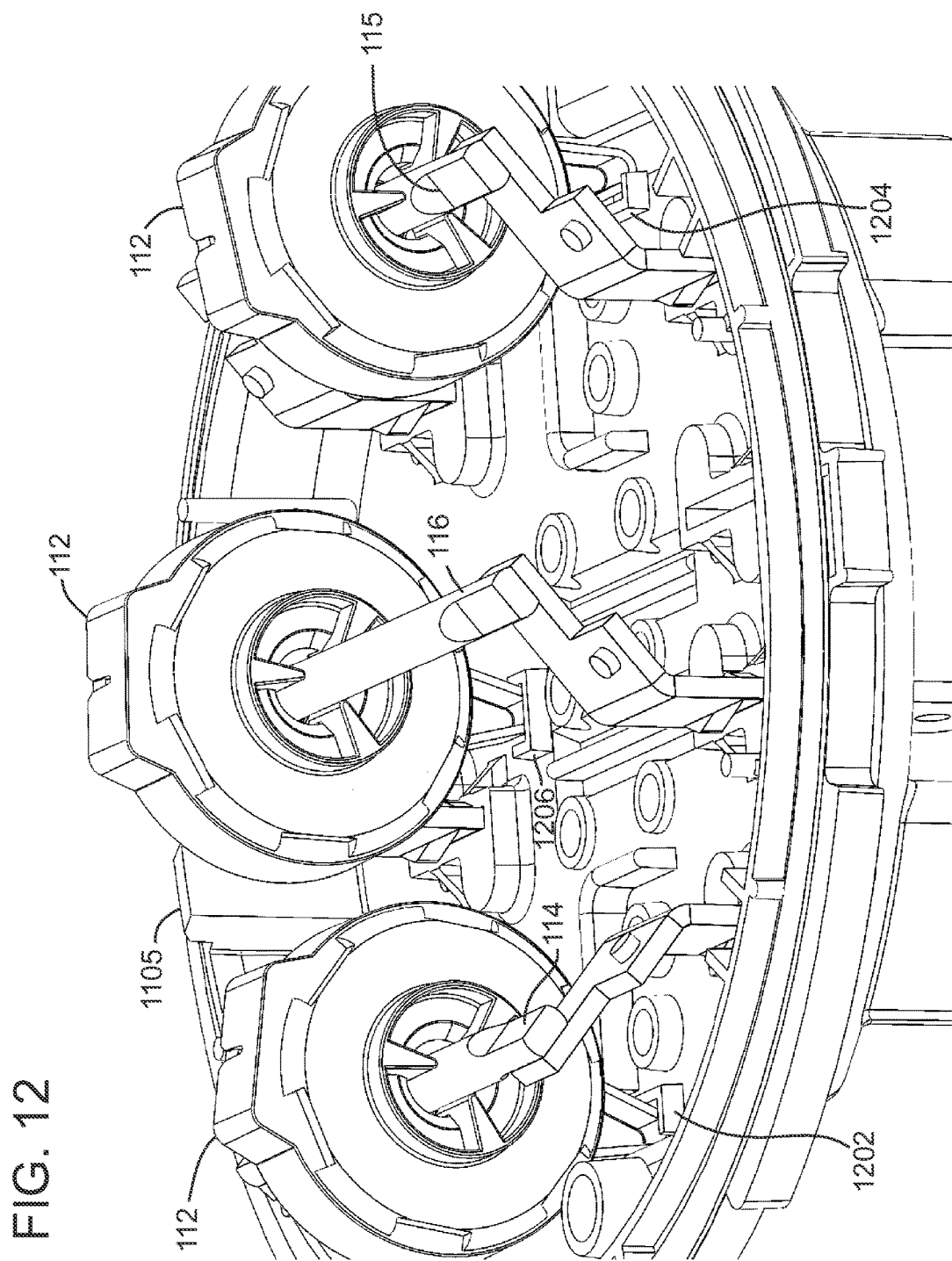
FIG. 12 is a cut-away view of a utility meter with three sensor devices measuring three conductors.

FIG. 11 is a cut-away view of a utility meter 110 with two sensor devices 112 measuring two conductors 114 and 115. A meter housing 1105 encloses sensor devices 112 and conductors 114 and 115. Each rotational positioner 320 of each sensor device 112 is positioned in the corner of meter housing 1105 to prevent rotational movement of the corresponding sensor device 112. FIG. 12 is a cut-away view of a utility meter 110 with three sensor devices measuring three conductors 114, 115, and 116. Meter housing 1105 includes three ribs 1202, 1204, and 1206. Ribs 1202, 1204, and 1206 couple to rotational positioners 320, thereby preventing rotational movement of sensor devices. It should be appreciated, however, that rotational positioners 320 may be positioned or used in other manners to prevent rotational movement in other sensor device embodiments.

One or more of the above described embodiments provide a highly-accurate sensor device. More specifically, the sensor devices, utility meters, and methods described herein may provide a highly-accurate sensor device that provides an expanded operating range with reduced calibration requirements over known coil sensors. For example, the disclosed dielectric material may provide reduced capacitance between a coil and one or more conductors, thereby providing improved accuracy across a range of currents and/or voltages. The improved accuracy may be realized with fewer calibration processes during manufacturing, resulting in reduced manufacturing cost and/or time. In another example, the disclosed shielding techniques provide improved rejection of EMI, originating from other electronics and/or tampering devices.

The above described embodiments provide systems and methods for preventing the coil of a sensor device from moving in relation to the conductor that the sensor device is measuring. More specifically, the sensor devices when used in utility meters will provide high accuracy measurement of current through conductors over a period of many years. By preventing the coil from moving, the calibration of the sensor devices will stay the same and ensure accurate measurements for many years.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A sensor device for use in detecting current in a conductor, said sensor device comprising: a non-magnetic substrate defining an aperture through which a conductor is received; a coil comprising a plurality of turns wound about at least a portion of said substrate; and a housing enclosing said substrate and said coil, said housing including the aperture formed by said non-magnetic substrate and comprising: a dielectric material having a dielectric constant, said dielectric material positioned adjacent to said coil and at least partially within said aperture for said dielectric material to be disposed between said coil and said conductor when said conductor is received through said aperture; and an offset ring fitting within said aperture with an outer end of the offset ring projecting perpendicular to an outer face of said housing for said ring to be offset from said housing, said offset ring including at least one spacer extending between said offset ring and said conductor so to maintain a position of said coil relative to said conductor, said spacer extending into said aperture from said outer end of said offset ring so to be offset from said aperture, said offset ring ensuring that said sensor device is spaced a distance away from any object in a meter with which said sensor device is used.

2. The sensor device of claim 1, wherein said housing is installed in a meter housing and the sensor device includes at least one rotational positioner positioned so as to prevent the sensor device from rotating around said conductor.

3. The sensor device of claim 1, wherein said non-magnetic substrate comprises a plurality of bobbins, said plurality of bobbins defining said aperture, and said coil comprises a plurality of coil turns wound about each of said plurality of bobbins.

4. The sensor device of claim 1, wherein said dielectric material comprises a first side and a second side, said first side defining said aperture disposed between said conductor and said coil and comprising a first thickness, wherein said second side extends perpendicular to said first side and comprises a second thickness which is less than said first thickness, said second side attaching to said first side along an edge which is beveled in relation to said first side, and said second side and said edge resulting in an edge thickness which varies between said first thickness and said second thickness.

5. The sensor device of claim 1, wherein the housing further comprises an epoxy which is positioned between said dielectric material and said coil, for said epoxy to attach said coil to said dielectric material.

6. The sensor device of claim 5, wherein said epoxy cures at room temperature.

7. The sensor device of claim 1, wherein said offset ring includes three spacers circumferentially spaced around said offset ring and extending between said offset ring and said conductor so to maintain the position of said coil relative to said conductor, each said spacer extending into said aperture from said outer end of said offset ring so to be offset from said aperture.

8. The sensor device of claim 7, wherein said housing further comprises a first portion and a second portion, said second portion coupling to said first portion so to enclose said coil within the housing, said first portion and said second portion overlapping each other.

9. The sensor device of claim 8, wherein said second portion comprises at least one clip and said first portion comprises at least one retaining portion, wherein said at least one clip couples to said at least one retaining portion to couple said first portion to said second portion, and wherein when said first portion is coupled to said second portion said at least one clip is flush with the first portion.

10. A utility meter for use in transmitting electrical energy from a power source to a user; said utility meter comprising: a first sensor device positioned at least partially around a first conductor to sense a current flowing through said first conductor and to output a signal representative of said sensed current, said first sensor device comprising: a non-magnetic substrate defining an aperture structured to receive said first conductor therein; a coil comprising a plurality of turns wound about at least a portion of said substrate; and a housing enclosing said substrate and said coil, said housing comprising: a dielectric material having a dielectric constant and positioned adjacent to said coil and at least partially within said aperture defined by said non-magnetic substrate for said dielectric material to be disposed between said coil and said first conductor when said first conductor is received through said aperture; an offset ring fitting within said aperture with an outer end of the offset ring projecting perpendicular to an outer face of said housing for said ring to be offset from said housing, said offset ring including at least one spacer extending between said offset ring and said first conductor to maintain a position of said coil relative to said first conductor, said spacer extending into said aperture from said outer end of said of said offset ring so to be offset from said aperture, said offset ring ensuring that said sensor device is spaced a distance away from any object in a meter with which said sensor device is used; and a meter control board in communication with said first sensor device to receive said signal representative of said sensed current from said first sensor device and to determine an amount of electricity transmitted through said first conductor from the power source to the user over time; wherein said first sensor device is positioned relative to said first conductor to reduce a sensitivity of said first sensor device such that said meter control board requires only one calibration coefficient for calibrating said first sensor device over a current range which extends from approximately 0.2 A to approximately 25,000 A.

11. The utility meter of claim 10, wherein the housing further comprises an epoxy positioned between said dielectric material and said coil, said epoxy attaching said coil to said dielectric material.

12. The utility meter of claim 10, wherein the housing includes at least one rotational positioner positioned to prevent the sensor device from rotating around said first conductor.

13. The utility meter of claim 10, wherein said non-magnetic substrate comprises a plurality of bobbins defining said aperture and said coil comprises a plurality of coil turns wound about each of said plurality of bobbins.

14. The utility meter of claim 10, wherein said dielectric material comprises a first side and a second side, said first side defining said aperture and being disposed between said conductor and said coil and having a first thickness, wherein said second side extends perpendicular to said first side and comprises a second thickness which is less than said first thickness, said second side attaching to said first side along an edge which is beveled in relation to said first side, and said second side and said edge resulting in an edge thickness which varies between said first thickness and said second thickness.

15. The utility meter of claim 10, further comprising a second sensor device also in communication with said meter control board, wherein said second sensor device is positioned at least partially around a second conductor, wherein said first sensor device is positioned relative to said second sensor device so to reduce the sensitivity of said first sensor device and a sensitivity of said second sensor device whereby said meter control board requires only one calibration coefficient for calibrating each of said first and second sensor devices over said current range.

16. The utility meter of claim 15, further comprising a third sensor device also in communication with said meter control board, wherein said third sensor device is positioned at least partially around a third conductor, wherein said first sensor device is positioned relative to said second sensor device and said third sensor device so to reduce the sensitivities of said first sensor device, said second sensor device, and said third sensor device whereby said meter control board requires only one calibration coefficient for calibrating each of said first, second, and third sensor devices over said current range.

17. The utility meter of claim 10, wherein said offset ring includes three spacers circumferentially spaced about said offset ring and extending between said offset ring and said conductor so to maintain the position of said coil relative to said conductor, each said spacer extending into said aperture from said outer end of said offset ring so to be offset from said aperture.

18. The utility meter of claim 17, wherein said housing further comprises a first portion and a second portion, said second portion coupling to said first portion so to enclose said coil within the housing, said first portion and said second portion overlapping each other.

19. The utility meter of claim 18, wherein said second portion comprises at least one clip and said first portion comprises at least one retaining portion, wherein said at least one clip couples to said at least one retaining portion to couple said first portion to said second portion, and wherein when said first portion is coupled to said second portion said at least one clip is flush with the first portion.

20. A method of fabricating a utility meter for use in transmitting electrical energy from a power source to a user, the method comprising: providing a first sensor device positioned at least partially around a first conductor to sense a current flowing through said first conductor and to output a signal representative of said sensed current, wherein providing said first sensor device comprises: forming a coil comprising a plurality of turns wound about a non-magnetic substrate, said coil defining an aperture through which said first conductor is received, and enclosing in a housing said coil and said non-magnetic substrate, wherein enclosing in said housing comprises: positioning a dielectric material adjacent to said coil and at least partially within said aperture such that said dielectric material is disposed between said coil and said first conductor when said first conductor is received through said aperture; and positioning an offset ring within said aperture with an outer end of said offset ring projecting perpendicular to an outer face of said housing for said ring to be offset from said housing, said offset ring including at least one spacer extending between said offset ring and said first conductor so to maintain a position of said coil relative to said first conductor, said spacer extending into said aperture from said outer end of said offset ring so to be offset from said aperture, said offset ring ensuring that said sensor device is spaced a distance away from any object in a meter with which said sensor device is used; connecting a meter control board with said first sensor device to receive said signal representative of said sensed current from said first sensor device and to determine an amount of electricity transmitted through said first conductor from the power source to the user over time; positioning said first sensor device relative to said first conductor to reduce a sensitivity of said sensor device whereby said meter control board requires only one calibration coefficient for calibrating said sensor device over a current range extending between approximately 0.2 A and approximately 25,000 A.

21. The method of claim 20, further comprising positioning said first device relative to a second sensor device, wherein said second sensor device is positioned at least partially around a second conductor and said second sensor device is connected to said meter control board, wherein said first sensor device is positioned relative to said second sensor device to reduce the sensitivity of said first sensor device and a sensitivity of said second sensor device whereby said meter control board requires only one calibration coefficient for calibrating each of said first and second sensor devices over said current range.

22. The method of claim 21, further comprising positioning said first sensor device relative to said second sensor device and further relative to a third sensor device, wherein said third sensor device is positioned at least partially around a third conductor and said third sensor device is connected to said meter control board, wherein said first sensor device is positioned relative to said second sensor device and said third sensor device to reduce the sensitivity of said first sensor device, the sensitivity of said second sensor device, and a sensitivity of said third sensor device whereby said meter control board requires only one calibration coefficient for calibrating each of said first, second and third sensor devices over said current range.

23. A sensor device for use in detecting current in a conductor, said sensor device comprising: a non-magnetic substrate defining an aperture through which a conductor is received; a coil comprising a plurality of turns wound about at least a portion of said substrate; and a housing enclosing said substrate and said coil, said housing including the aperture formed by said non-magnetic substrate and comprising: a dielectric material having a dielectric constant, said dielectric material positioned adjacent to said coil and at least partially within said aperture for said dielectric material to be disposed between said coil and said conductor when said conductor is received through said aperture; and an offset ring fitting within said aperture with an outer end of the offset ring projecting perpendicular to an outer face of said housing for said ring to be offset from said housing, said offset ring including three spacers circumferentially spaced around said offset ring and extending between said offset ring and said conductor so to maintain the position of said coil relative to said conductor, each said spacer extending into said aperture from said outer end of said offset ring so to be offset from said aperture, and each spacer being shaped as a crushed rib with a curved point.

* * * * *